United States Patent
Bader et al.

(10) Patent No.: US 7,642,565 B2
(45) Date of Patent: Jan. 5, 2010

(54) RADIATION-EMITTING SEMICONDUCTOR COMPONENT BASED ON GALLIUM NITRIDE, AND METHOD FOR FABRICATING THE SEMICONDUCTOR COMPONENT

(75) Inventors: Stefan Bader, Eilsbrunn (DE); Berthold Hahn, Hemau (DE); Volker Härle, Laaber (DE); Hans-Jürgen Lugauer, Sinzing (DE)

(73) Assignee: Osram GmbH, Munich (DE)

(*) Notice: Subject to any disclaimer, the term of this patent is extended or adjusted under 35 U.S.C. 154(b) by 120 days.

(21) Appl. No.: 10/439,084

(22) Filed: May 15, 2003

(65) Prior Publication Data
US 2003/0218181 A1 Nov. 27, 2003

Related U.S. Application Data

(63) Continuation of application No. PCT/DE01/04302, filed on Nov. 15, 2001.

(30) Foreign Application Priority Data
Nov. 15, 2000 (DE) ................ 100 56 475

(51) Int. Cl.
*H01L 33/00* (2006.01)
(52) U.S. Cl. ............. 257/103; 257/101; 257/102; 372/45.011
(58) Field of Classification Search ........... 257/79–103; 372/43–50
See application file for complete search history.

(56) References Cited

U.S. PATENT DOCUMENTS

| 5,290,393 | A | * | 3/1994 | Nakamura | ............. 438/509 |
| 5,585,648 | A | * | 12/1996 | Tischler | ............. 257/103 |
| 5,793,054 | A | | 8/1998 | Nido | |
| 5,874,747 | A | | 2/1999 | Redwing et al. | |
| 6,072,197 | A | * | 6/2000 | Horino et al. | ............. 257/103 |
| 6,147,364 | A | | 11/2000 | Itaya et al. | |
| 6,156,581 | A | * | 12/2000 | Vaudo et al. | ............. 438/22 |
| 6,194,742 | B1 | * | 2/2001 | Kern et al. | ......... 372/45.011 |
| 6,335,218 | B1 | | 1/2002 | Ota et al. | |
| 6,518,082 | B1 | | 2/2003 | Kidoguchi et al. | |

(Continued)

FOREIGN PATENT DOCUMENTS

DE 197 34 034 C2 7/2000

(Continued)

OTHER PUBLICATIONS

Takeuchi et al, "Improvement of far-field pattern in laser diodes", Applied Physics Letters vol. 75, No. 19, pp. 2960-296 (1999) (IDS).*

(Continued)

*Primary Examiner*—Johannes Mondt
(74) *Attorney, Agent, or Firm*—Cohen Pontani Lieberman & Pavane LLP

(57) ABSTRACT

A radiation-emitting semiconductor component has a high p-type conductivity. The semiconductor body of the component includes a substrate, preferably an SiC-based substrate, on which a plurality of GaN-based layers have been formed. The active region of these layers is arranged between at least one n-conducting layer and a p-conducting layer. The p-conducting layer is grown in tensile-stressed form. The p-doping that is used is preferably Mg.

11 Claims, 2 Drawing Sheets

U.S. PATENT DOCUMENTS

| | | | |
|---|---|---|---|
| 6,563,850 B1 * | 5/2003 | Matsumoto et al. | 372/45.01 |
| 6,613,143 B1 * | 9/2003 | Melnik et al. | 117/84 |
| 2001/0030318 A1 * | 10/2001 | Nakamura et al. | 257/13 |

FOREIGN PATENT DOCUMENTS

| | | |
|---|---|---|
| EP | 0 716 457 A2 | 6/1996 |
| EP | 1 049 178 A2 | 11/2000 |
| WO | 96/36080 | 11/1996 |
| WO | 00/21144 | 4/2000 |

OTHER PUBLICATIONS

Acord et al, "In situ stress measurements during MOCVD growth of AlGaN on SiC", Journal of Crystal Growth, vol. 272, pp. 65-71.*

"Modern Semcionductor Device Physics", Editor: S.M. Sze, Appendix F (p. 537), John Wiley & Sons, New York 1998.*

Amano et al, "Metalorganic vapor phase epitaxial growth of a high quality GaN film using an AlN buffer layer", Applied Physics Letters 48 (5), Feb. 3, 1986, pp. 353-355 (American Institute of Physics).*

O. Madelung, "Semiconductor s—Basic Data", $2^{nd}$ revised Edition, Springer Verlag 1996 (ISBN: 3-540-60883-4), pp. 86-89.*

Russell D. Dupuis, "III-V Semiconductor Heterojunction Devices Grown by Metalorganic Chemical Vapor Deposition", IEEE Journal on Selected Tpoics in Quantum Electronics, vol. 6, No. 6, Nov./Dec. 2000, pp. 1040-1050.*

S. Nakamura et al.: "The Blue Laser Diode", *Springer Verlag*, 1997, pp. 224-225, 228, and 234-235.

Kuramata, A. et al.: "Room-Temperature Continuous Wave Operation in InGaN Laser Diodes with Vertical Conducting Structure on SiC Substrate", Japanese Journal of Applied Physics, vol. 37, Part 2, No. 11B, Nov. 15, 1998, pp. L1373-L1375.

Han, J. et al.: "Monitoring and Controlling of Strain During MOCVD of AlGaN for UV Optoelectronics", Materials Research Society, vol. 537, Nov. 30, 1998, pp. 1-6.

Kurimoto, M. et al.: "Growth of BGaN/AlGaN Multi-Quantum-Well Structure by Metalorganic Vapor Phase Epitaxy", Journal of Crystal Growth 221, Elsevier, 2000, pp. 378-381.

Lahrèche, H. et al.: "Buffer Free Direct Growth of GaN on 6H-SiC by Metalorganic Vapor Phase Epitaxy", Journal of Applied Physics, American Institute of Physics, vol. 87, No. 1, Jan. 1, 2000, pp. 577-583.

Takeuchi, T. et al.: "Improvement of Far-Field Pattern in Nitride Laser Diodes", Applied Physics Letters, American Institute of Physics, vol. 75, No. 19, Nov. 8, 1999, pp. 2960-2962.

Perry, W. G. et al.: "Biaxial Strain $Al_xGa_{1-x}N$/GaN Layers Deposited on 6H-SiC", Elsevier, Thin Solid Films 324, 1998, pp. 107-114.

* cited by examiner

RADIATION-EMITTING SEMICONDUCTOR COMPONENT BASED ON GALLIUM NITRIDE, AND METHOD FOR FABRICATING THE SEMICONDUCTOR COMPONENT

CROSS-REFERENCE TO RELATED APPLICATION

This application is a continuation of copending International Application No. PCT/DE01/04302, filed Nov. 15, 2001, which designated the United States and was not published in English.

BACKGROUND OF THE INVENTION

Field of the Invention

The invention lies in the semiconductor technology field. More specifically, the invention relates to a radiation-emitting semiconductor component based on gallium nitride (GaN). The component has a semiconductor body, which includes a substrate, in particular an SiC-based substrate, to which a plurality of GaN-based layers have been applied, this plurality of GaN-based layers including at least one active region which is arranged between at least one n-conducting layer and at least one p-conducting layer. The invention also pertains to a fabrication method for a semiconductor body having at least one p-conducting GaN-based layer.

Radiation-emitting components based on GaN are known, for example, from U.S. Pat. No. 5,874,747. Semiconductor components of that type include a semiconductor body with a plurality of layers which consist of GaN or a material based thereon. According to the document cited, the plurality of GaN-based layers has been applied to an SiC substrate.

GaN-based materials are materials which are derived from GaN or related to GaN as well as ternary or quaternary solid solutions built up on the basis of GaN. In particular, these include the materials AlN, InN, AlGaN ($Al_{1-x}Ga_xN$, $0 \leq x \leq 1$), InGaN ($In_{1-x}Ga_xN$, $0 \leq x \leq 1$), InAlN ($In_{1-x}Al_xN$, $0 \leq x \leq 1$) and AlInGaN ($Al_{1-x-y}In_xGa_yN$, $0 \leq x \leq 1$, $0 \leq y \leq 1$).

In the context of this specification, the term "GaN-based" covers these ternary or quaternary solid solutions, compounds derived from GaN or related to GaN and GaN itself. Furthermore, this term also covers materials which are used to form buffer layers in the epitaxial formation of layers belonging to the materials systems listed.

It is known from U.S. Pat. No. 5,874,747 to form an active region which is used to generate the radiation and is surrounded by at least one n-conducting and one p-conducting layer in the semiconductor body.

The production of p-conducting layers based on GaN with a sufficiently high conductivity entails a wide range of technical problems. The doping used is generally Mg, Zn or C. The energy levels of these acceptors are between 200 meV and 300 meV above the valence band edge, so that, with a band gap of the order of magnitude of 3.4 eV, as is present with GaN, only a very small proportion of the acceptors are ionized.

An increase in the hole concentration as a result of the rise in the chemical acceptor concentration is limited by self-compensation effects. If the acceptor doping is too strong, for example, defects are formed in the crystal, acting as a donor and therefore compensating for the acceptor doping.

Since the energy position of the acceptor levels and the maximum chemical concentration cannot be influenced to a sufficient extent, to achieve the highest possible p-type conductivity, it is necessary for the acceptor atoms to be efficiently incorporated at electrically active sites of the host lattice. The efficiency of incorporation is measured primarily by the resulting hole concentration and the mobility of these holes.

SUMMARY OF THE INVENTION

It is accordingly an object of the invention to provide a gallium nitride-based, radiation-emitting semiconductor component, which overcomes the above-mentioned disadvantages of the heretofore-known devices and methods of this general type and which has improved p-type conductivity. A further object of the invention is to provide an advantageous method for fabricating the semiconductor component.

With the foregoing and other objects in view there is provided, in accordance with the invention, a radiation-emitting semiconductor component, comprising:

a semiconductor body formed of a substrate and a plurality of GaN-based layers applied on the substrate;

the plurality of GaN-based layers including at least one active region arranged between at least one n-conducting layer and at least one p-conducting layer, and the p-conducting layer being a layer grown on in tensile-stressed form.

With the above and other objects in view there is also provided, in accordance with the invention, a method of fabricating a semiconductor body having at least one p-conducting GaN-based layer. The method comprises the steps of:

providing a crystal surface having a lattice constant greater than a lattice constant of the p-conducting GaN-based layer to be formed;

applying the GaN-based layer to the crystal surface; and doping the GaN-based layer with an acceptor material.

According to the invention, it is provided for a plurality of GaN-based layers to be formed on a substrate, these layers in part forming the active region, i.e., the region which is used to generate radiation. This active region is arranged between at least one n-conducting layer and at least one p-conducting layer, the at least one p-conducting layer being grown in tensile-stress form and the direction of tensile stresses lying substantially parallel to the layer plane. This stressing of the crystal lattice advantageously increases the incorporation of the acceptor atoms compared to a compression-stressed lattice.

In the invention, it is preferable for the substrate used to be an SiC-based substrate. In this context, an SiC-based substrate is to be understood as meaning a substrate which consists of SiC or contains SiC and the thermal properties of which are substantially determined by SiC. Subregions of the substrate, in particular the boundary surface used for application of the GaN layers, may have a composition which differs from SiC.

The p-doping is preferably Mg, Zn and/or C, since these doping materials have proven their worth in epitaxial fabrication and can therefore be used without major technical problems.

In a preferred refinement of the invention, the at least one p-conducting layer contains AlGaN. Layers of this type are used as an electron barrier and therefore increase the quantum efficiency of radiation-emitting semiconductor components. Furthermore, AlGaN layers are distinguished by good epitaxial growth properties. Also, on account of their difference in refractive index with respect to GaN and InGaN, layers of this type are suitable for forming waveguide structures.

A preferred configuration of the invention consists in the p-conducting layer being grown on a layer whose lattice constant is greater than the lattice constant of the p-conducting layer in the unstressed state, so that the above-described state of a tensile-stressed p-conducting layer advantageously results.

The n-conducting layer is preferably arranged between the SiC-based substrate and the active region, and the p-conducting layer is preferably arranged on that side of the active region which is remote from the SiC substrate. Furthermore, the n-conducting layer preferably likewise contains AlGaN, since this material provides better wetting of an SiC-based substrate than GaN and therefore allows epitaxial fabrication of GaN layers of high quality on the substrate.

In this context, an n-conducting layer which, like the p-conducting layer, contains AlGaN is particularly preferred, the Al content of the n-conducting layer being lower than the Al content of the p-conducting layer, and the active region between them being formed to be so thin that the lattice constant is defined by the n-conducting layer. Since the lattice constant of AlGaN layers increases as the Al drops, therefore, the lower Al content of the n-conducting layer can produce a greater lattice constant beneath the p-conducting layer. This in turn results in the advantageous tensile stressing in the p-conducting layer.

In an advantageous refinement of the invention, the active region is formed as a quantum well structure, preferably as a multiple quantum well structure (MQW). These structures are distinguished by a particularly high quantum efficiency. The active region is preferably formed by a sequence of GaN and InGaN quantum layers.

A further preferred configuration of the invention consists in the active region being surrounded by a waveguide structure. This configuration is particularly advantageous for GaN-based semiconductor lasers in order to limit the radiation field to the active region and thereby to keep the pump current of the laser at a low level. The waveguide structure preferably consists of an n-doped and a p-doped GaN layer, which is arranged between the active region and the correspondingly doped GaN-based layer.

In the method according to the invention for fabricating a p-conducting, GaN-based layer, there is provision for a GaN-based layer to be applied to a crystal surface, the lattice constant of which is greater than the lattice constant of the GaN-based layer (in the unstressed state). The GaN-based layer is doped with an acceptor, it being possible for the doping to take place during the growth or after the growth.

On account of the lattice mismatch, the GaN-based layer is tensile-stressed, the direction of tensile stress lying substantially parallel to the layer plane. This stress state leads to an improved incorporation of the acceptor atoms, preferably Mg, Zn or C atoms, in the host crystal lattice. The improved incorporation manifests itself primarily in an increase in the hole concentration and the hole mobility and therefore advantageously increases the p-conductivity.

The GaN-based layer is preferably applied epitaxially. During the growth, the GaN-based layer can advantageously be p-doped at the same time, in which case, on account of the lattice mismatch, the GaN-based layer grows in tensile-stressed form and in this way the p-doping is incorporated in the GaN-based crystal lattice with a high level of efficiency in terms of its electrical properties. Starting materials used for the doping may, for example, be $Cp_2Mg$ (magnesium biscyclopentadienyl), DMZ (Dimethylzinc) or $CCl_4$ (carbon tetrachloride).

In an advantageous configuration of the fabrication method according to the invention, the p-conducting GaN-based layer contains AlGaN. Before this p-conducting AlGaN layer is applied, it is preferable to form an AlGaN layer, the Al content of which is lower than the Al content of the p-conducting AlGaN layer in the semiconductor body. Since the lattice constant of a AlGaN layer increases as the Al content drops, the advantageous tensile stressing in the p-conducting layer is advantageously brought about in this way and the associated improved p-type conductivity is attained.

In a preferred refinement of the fabrication method according to the invention, the Al content in the AlGaN layer previously formed varies in the direction of the layer normal, the Al content at the boundary surface which faces the p-AlGaN layer being lower than the Al content of the p-AlGaN layer.

A high Al content on the substrate side is advantageous for the epitaxial application of the interlayer to Si and SiC substrates, since AlGaN layers with a high Al content provide improved wetting of the substrate and more readily form planar layers of high crystal quality. An Al concentration profile with an Al content which drops at increasing distance from the substrate results on the substrate side in a high Al content, which is favorable for the epitaxy, and, at the same time, a tensile stressing of the p-AlGaN layer.

Other features which are considered as characteristic for the invention are set forth in the appended claims.

Although the invention is illustrated and described herein as embodied in a radiation-emitting semiconductor component based on GaN, and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
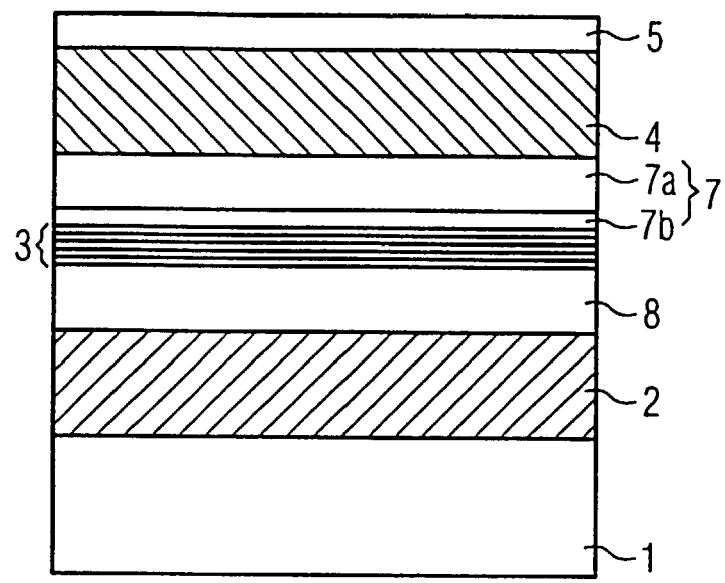
FIG. 1 is a diagrammatic sectional illustration of an exemplary embodiment of a semiconductor component according to the invention.

Referring now to the figures of the drawing in detail and first, particularly, to FIG. 1 thereof, there is shown an exemplary embodiment with the structure of a semiconductor laser based on GaN. The substrate 1 used in this context is a silicon carbide (SiC) substrate, to which a 700 nm thick n-conducting AlGaN layer 2 has been applied (the layer thicknesses in the drawings are not to scale). The Al content of the layer 2 drops from 17% at the SiC interface to 9% at the opposite main surface of the layer 2. A 120 nm thick, Si-doped GaN layer 8 has been formed on the n-conducting layer 2 and is adjoined by the active region 3 in the form of a MQW structure (MQW, multiple quantum well). The MQW structure comprises an alternating fourfold sequence of a 2 nm thick InGaN layer and a 12 nm thick GaN layer closed off by a 2 nm thick InGaN layer.

The layer sequence 3 is followed by a p-conducting GaN-based double layer 7 with a total thickness of 120 nm which comprises a Mg-doped AlGaN layer 7a and an Mg-doped GaN layer 7b. This double layer 7 and the n-conducting GaN layer 8 arranged beneath the active region together form a symmetrical waveguide which delimits the radiation field generated and concentrates it on the radiation-active region 3. Since the layer thickness of the p-conducting double layer 7 is relatively small, there is no need for this layer to be tensile-stressed in order to increase the p-conductivity.

A 400 nm thick p-conducting layer 4, which consists of Mg-doped AlGaN with an Al content of 12%, has been formed on the second waveguide layer 7. The semiconductor structure is completed by a highly p-doped GaN contact layer 5 with a thickness of 100 nm.

The lattice constant of an epitaxy layer is determined primarily by the lattice constant of the layer in the unstressed state, the thickness of the layer and the lattice constant of the layers below. In the exemplary embodiment, the lattice constant of the layers lying beneath the p-conducting layer 4 is substantially determined by the n-conducting AlGaN layer 2, the thickness of which, at 700 nm, is far greater than the thickness of the active MQW region 3 including the waveguide structure 7, 8. The Al concentration of the p-conducting layer 4 is selected to be greater than the Al concentration of the n-conducting layer 2, so that the Mg-doped, p-conducting layer 4 has grown in tensile-stressed form. This stressed state advantageously leads to an increased p-conductivity compared to a compression-stressed p-conductive layer.

The above-mentioned stressing of the p-conducting layer 4 relates in particular to the state during or immediately after fabrication of the semiconductor body, i.e. before the component has cooled. During cooling, the stressed state of the semiconductor body may change or even be reversed, depending on the expansion coefficient of the substrate. In the case of an SiC substrate, the stressing described is substantially retained. A change in the stressing during cooling has only an insignificant influence on the efficiency of the acceptor atoms which have already been incorporated in the host lattice.

Figure 2A:
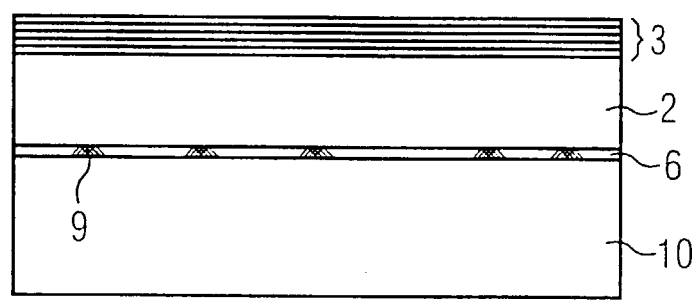
FIGS. 2A and 2B are two sequential diagrammatic sectional views illustrating a first exemplary embodiment of a fabrication method according to the invention.
Figure 2B:
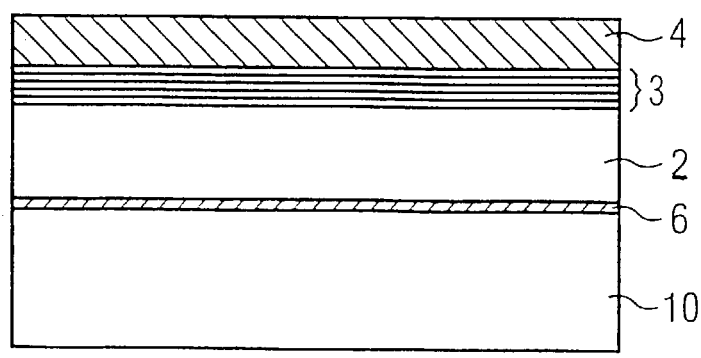

FIGS. 2A and 2B show two steps illustrating an exemplary embodiment of a fabrication method according to the invention.

First of all, a thin n-AlGaN buffer layer 6 is applied to an epitaxy substrate 10, preferably an SiC-based substrate. The standard organometal compounds, such as TMGa (trimethylgallium) or TEGa (triethylgallium), TMAl (trimethyaluminum) and TMIn (trimethylindium), are used for the epitaxy (MOVPE). $SiH_4$ (silane) is used for the n-doping and $Cp_2Mg$ (bis(cyclopentadienyl)magnesium) is used for the p-doping.

To increase the conductivity of the buffer layer 6, electrically conductive channels 9 can additionally be formed therein. For this purpose, by way of example, a thin GaN or InGaN layer can first be grown onto the epitaxy substrate 10. Since these compounds only wet Si and SiC to a small extent, the result is an incohesive layer comprising a plurality of GaN or InGaN islands of good conductivity which form the electrically conductive channels 9. The formation of the buffer layer 6 is completed by the application of a planarizing AlGaN filling layer with a high Al content which fills the spaces between the conduction channels 9 and forms a sufficiently homogenous surface for application of further layers. A buffer layer with conductive channels of this type can also be formed or used in the other two exemplary embodiments.

An Si-doped GaN layer 2 with a thickness in the μm range and an active region 3 in the form of a GaN/InGaN MQW structure are deposited on the buffer layer 6, FIG. 2A. On account of the low thickness of the quantum layers, the lattice constant is substantially determined by the GaN layer 2 below.

A Mg-doped and therefore p-conducting AlGaN layer 4 is applied to the active region, FIG. 2B. The lattice constant of an AlGaN layer increases as the Al content drops and is at its maximum for a pure GaN layer. Since the GaN layer 2 determines the lattice constant, the AlGaN layer 4 grows on a crystal surface whose lattice constant is greater than the lattice constant of the AlGaN layer 4. The result is a tensile-stressed AlGaN layer 4 which is distinguished by an improved incorporation of the Mg doping and therefore by a high p-conductivity.

In subsequent steps, further layers, for example a p-conducting, highly doped GaN contact layer, can be applied to this layer.

Figure 3A:
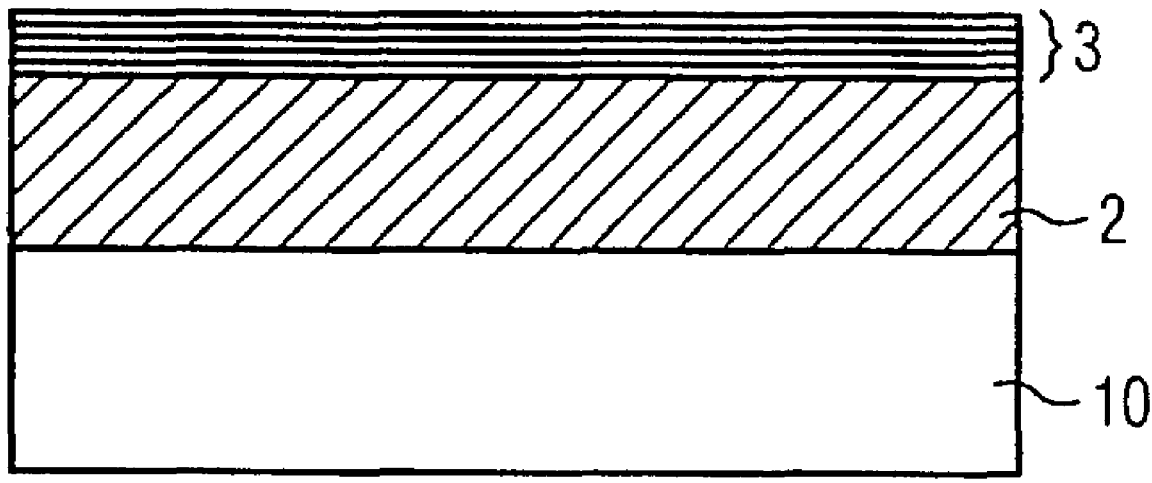
FIGS. 3A and 3B are two sequential diagrammatic sectional views illustrating a second exemplary embodiment of the fabrication method according to the invention.
Figure 3B:
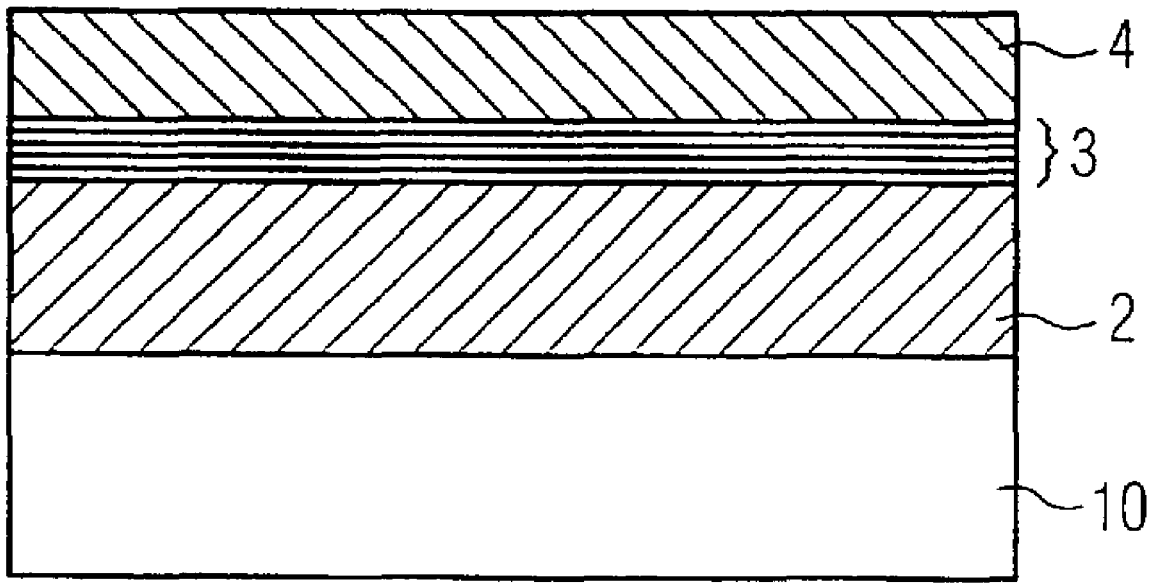

The exemplary embodiment of a fabrication method which is illustrated in FIGS. 3A and 3B differs from the example illustrated in FIGS. 2A and 2B in that an AlGaN layer 7 is formed instead of the GaN layer 2. A non-illustrated buffer layer as in the previous exemplary embodiment may likewise be provided. Once again the active region 3 is formed on the AlGaN layer 7, FIG. 3A. The active region may also be surrounded, in a manner which is not illustrated, by a waveguide structure as in FIG. 1.

An Mg-doped AlGaN layer 4 is deposited on the active region, FIG. 3B. The Al content of the layer 4 is in this case lower than the Al content of the AlGaN layer 2 at the interface with the region 3. Since the layer 2, on account of its thickness compared to the MQW structure, is again responsible for determining the lattice constant, the Mg-doped AlGaN layer 4 grows on a crystal surface with a higher lattice constant. In this way, the improved p-type conductivity is once again achieved.

The explanation of the invention with reference to the exemplary embodiments described is not, of course, to be understood as restricting the invention to these exemplary embodiments. In particular, the semiconductor structures shown can additionally be provided with contact surfaces, mounted on carriers and incorporated in housings using known and standard methods. Furthermore, the invention is in general terms suitable for nitride semiconductor compounds, in particular for nitride compounds of elements belonging to the third and/or fifth main group of the periodic system of the elements, the abovementioned compounds based on GaN being preferred.

We claim:

1. A radiation-emitting semiconductor component, comprising:
    a semiconductor body formed of a substrate and a plurality of GaN-based layers applied on said substrate;
    said plurality of GaN-based layers including at least one active region arranged between at least one n-conducting layer containing AlGaN and at least one p-conducting layer, and said p-conducting layer being a layer grown on in tensile-stressed form such that tensile stresses of the p-conducting layer extend in a direction substantially parallel to a plane of the layer;
    wherein said at least one n-conducting layer has an Al content lower than an Al content of said at least one p-conducting layer, and layers disposed between said at least one n-conducting layer and said at least one p-conducting layer are thinner than said at least one n-conducting layer so that a lattice constant thereof is defined by said at least one n-conducting layer; and
    wherein the Al content within said at least one n-conducting layer increases in a direction toward said substrate.

2. The semiconductor component according to claim 1, wherein said substrate is an SiC-based substrate.

3. The semiconductor component according to claim 1, wherein said at least one p-conducting layer is doped with at least one dopant selected from the group consisting of Mg, Zn, and C.

4. The semiconductor component according to claim 1, wherein said at least one p-conducting layer contains AlGaN.

5. The semiconductor component according to claim 1, wherein said at least one p-conducting layer is grown on a layer having a lattice constant greater than a lattice constant of said at least one p-conducting layer.

6. The semiconductor component according to claim 1, wherein said active region is formed as a quantum well structure.

7. The semiconductor component according to claim 1, wherein said active region is formed as a single quantum well structure or as a multiple quantum well structure.

8. The semiconductor component according to claim 6, wherein said quantum well structure is formed by a sequence of GaN and InGaN layers.

9. The semiconductor component according to claim 1, wherein said active region is encased in a waveguide structure.

10. The semiconductor component according to claim 9, wherein said waveguide structure consists of at least one GaN-based layer disposed between said active region and said at least one n-conducting layer and at least one-GaN based layer disposed between said active region and said at least one p-conducting layer.

11. The semiconductor component according to claim 1, wherein said at least one n-conducting layer is formed between said substrate and said active region.

* * * * *